US008624101B2

(12) United States Patent
Pei

(10) Patent No.: US 8,624,101 B2
(45) Date of Patent: Jan. 7, 2014

(54) ADJUSTABLE SOLAR POWER GENERATION APPARATUS

(75) Inventor: Shao-Kai Pei, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 219 days.

(21) Appl. No.: 13/211,244

(22) Filed: Aug. 16, 2011

(65) Prior Publication Data

US 2013/0008505 A1 Jan. 10, 2013

(30) Foreign Application Priority Data

Jul. 7, 2011 (TW) .............................. 100124126 A

(51) Int. Cl.
*H01L 31/042* (2006.01)
(52) U.S. Cl.
USPC .......................................................... 136/246
(58) Field of Classification Search
USPC .............................................. 136/246, 259
See application file for complete search history.

(56) References Cited

U.S. PATENT DOCUMENTS

| 4,055,761 A * | 10/1977 | Shimomura | 250/239 |
| 6,064,533 A * | 5/2000 | Kenin et al. | 359/695 |
| 2009/0277498 A1* | 11/2009 | Angel | 136/246 |

FOREIGN PATENT DOCUMENTS

| KR | 10-2010-0004020 A | * | 1/2010 | F24J 2/38 |
| WO | WO 2010098611 A2 | * | 9/2010 | 136/246 |

* cited by examiner

*Primary Examiner* — Miriam Berdichevsky
(74) *Attorney, Agent, or Firm* — Altis Law Group, Inc.

(57) ABSTRACT

An adjustable solar power generation apparatus includes a solar power generation unit, a base, and a supporting bar supporting the base. The base accommodates the solar power generation unit. The supporting bar supports the base. The solar power generation unit includes a fixed lens unit and a solar cell. The fixed lens unit includes a converging lens to converge sunlight. The solar cell is located in the fixed lens unit, and is capable of moving toward or away from the converging lens to adjust the light intensity received by the solar cell.

10 Claims, 5 Drawing Sheets

ADJUSTABLE SOLAR POWER GENERATION APPARATUS

BACKGROUND

1. Technical Field

The present disclosure relates to generation apparatus utilizing solar power, especially relating to an adjustable solar power generation apparatus.

2. Description of Related Art

Many solar power generation apparatus are equipped with a solar track system to follow the changing of solar position throughout the day to maximize receiving of solar radiation. However, the light intensity received by the solar cells will still fluctuate during the day. Therefore, the solar cells will age quickly, and the power output will fluctuate, influencing the stability of the apparatus. If such solar power generation is equipped with a zooming converged lens assembly to converge sunlight at different location and adjust the light intensity received by the solar cells, it will complicate the control process of the solar power generation apparatus.

What is needed, therefore, is an adjustable solar power generation apparatus that will overcome the afore mentioned shortcomings.

BRIEF DESCRIPTION OF THE DRAWINGS

Many aspects of the present adjustable solar power generation apparatus can be better understood with reference to the following drawings. The components in the drawings are not necessarily drawn to scale, the emphasis instead being placed upon clearly illustrating the principles of the present adjustable solar power generation apparatus. Moreover, in the drawings, like reference numerals designate corresponding parts throughout the views.

DETAILED DESCRIPTION

Figure 1:
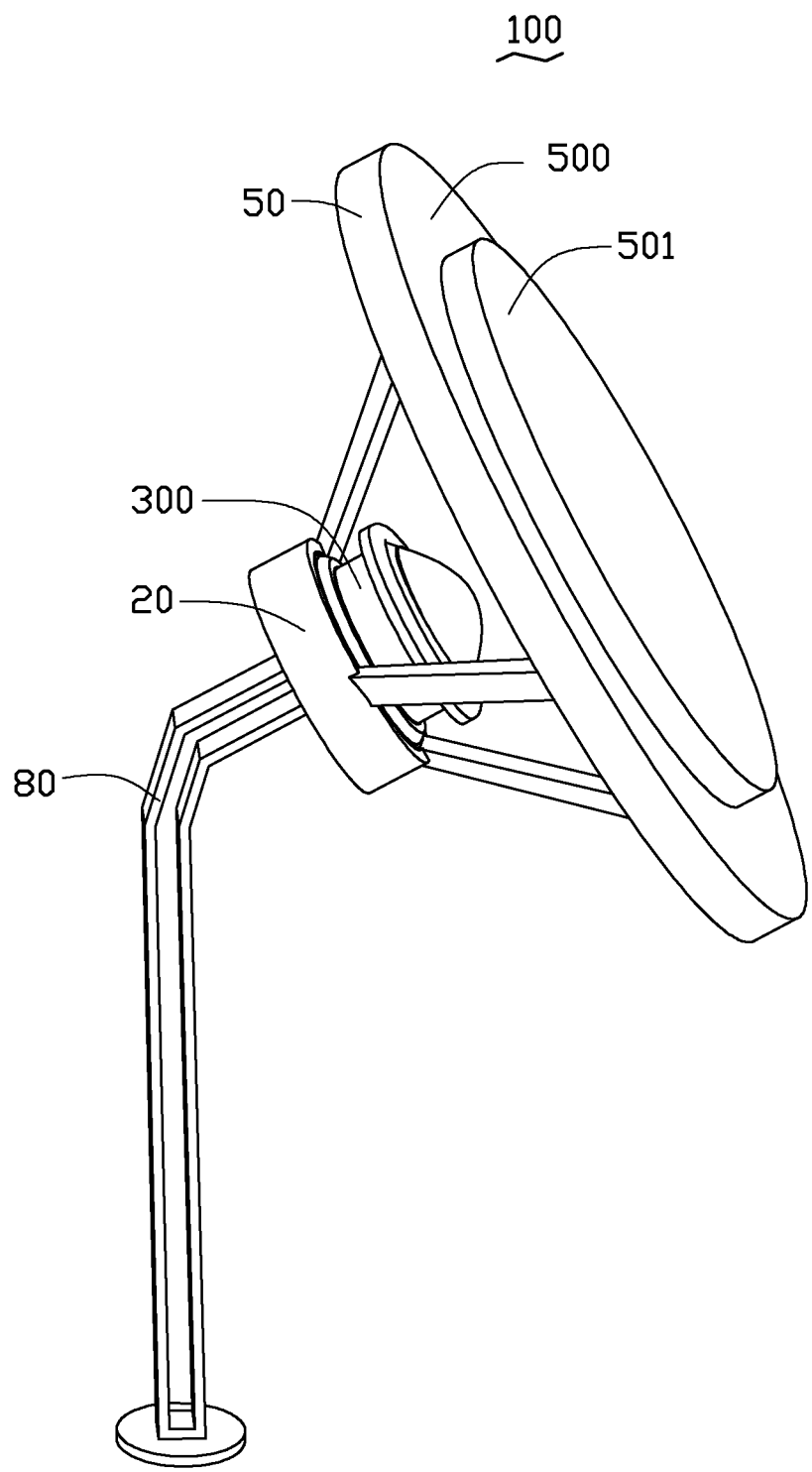
FIG. 1 is a schematic view of an adjustable solar power generation apparatus of a first exemplary embodiment.
Figure 2:
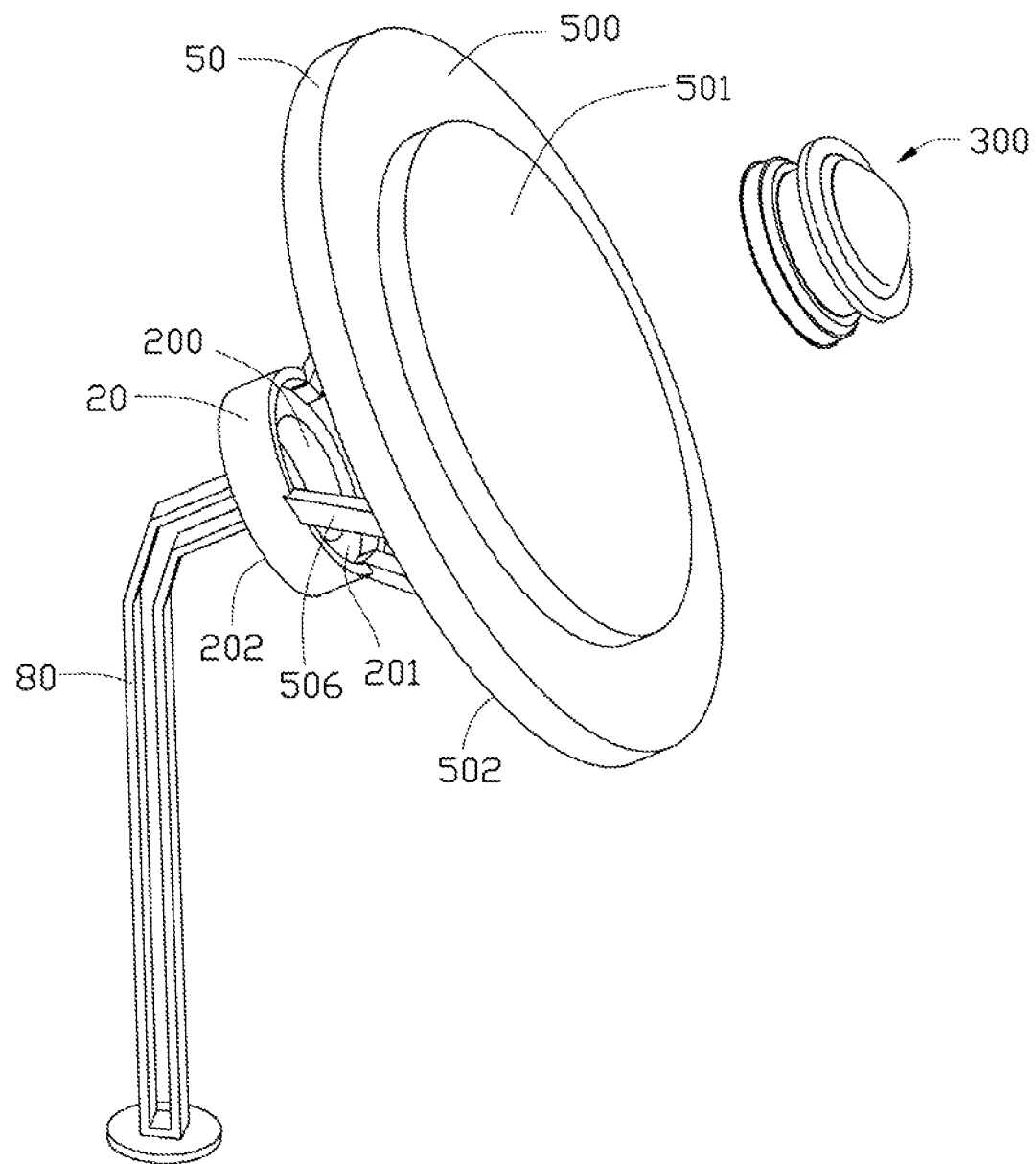
FIG. 2 is a partially exploded view about a solar power generation unit and the apparatus of FIG. 1.

Referring to FIGS. 1 and 2, an adjustable solar power generation apparatus 100 provided by a first exemplary embodiment includes a solar power generation unit 300, a cover 50, a base 20, and a supporting bar 80. The supporting bar 80 supports the base 20. The supporting bar 80 is capable of rotating according to the location of the sun. The base 20 accommodates the solar power generation unit 300. The cover 50 is located in front of the solar power generation unit 300. The cover 50 and the base 20 may be omitted.

Figure 3:
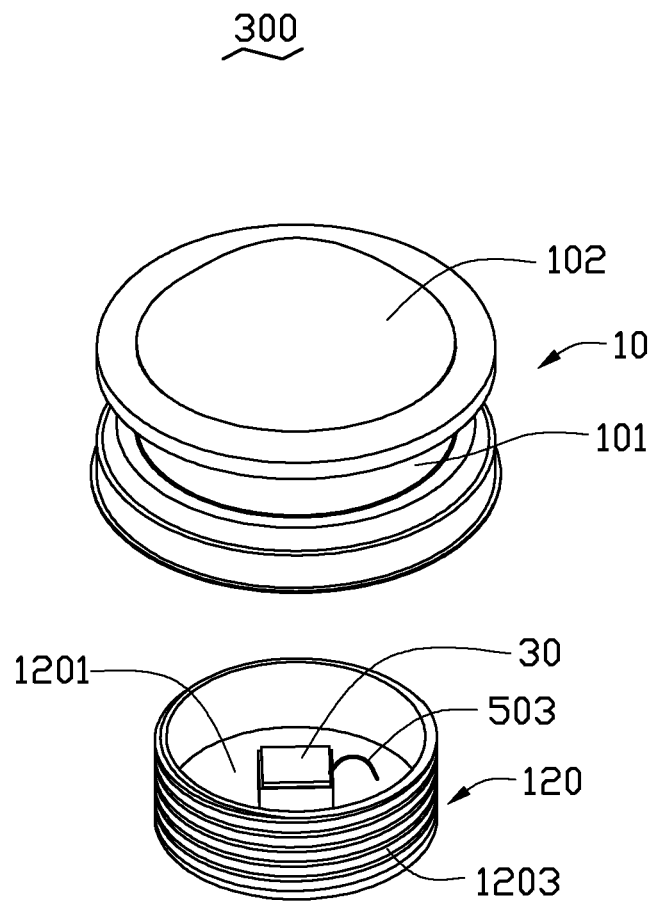
FIG. 3 shows the solar power generation unit of FIG. 2.
Figure 4:
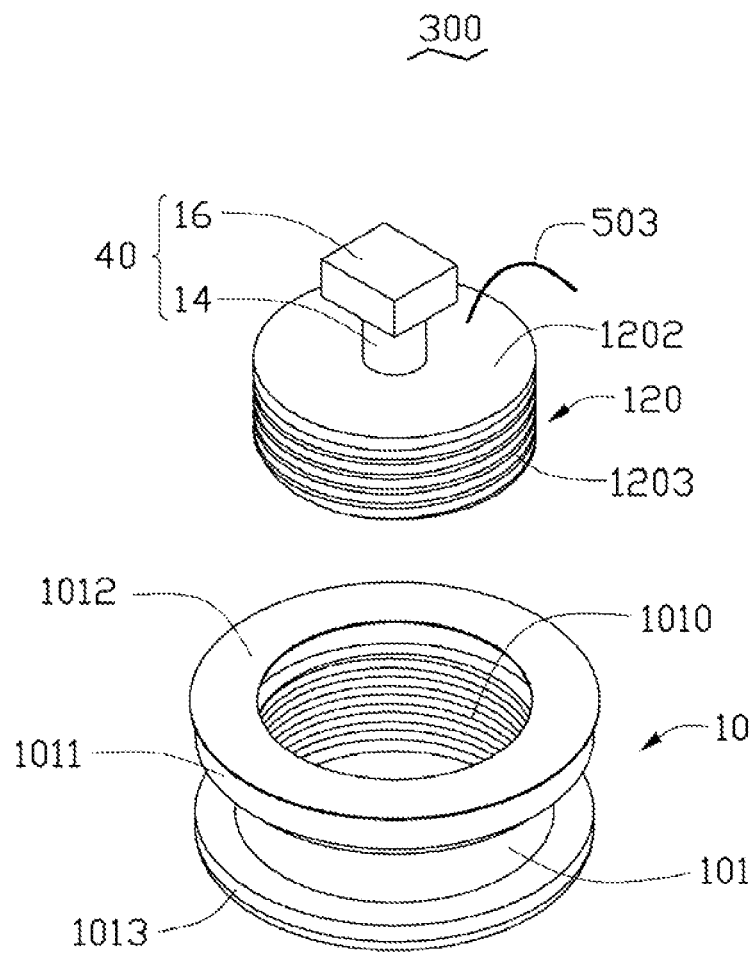
FIG. 4 is similar to FIG. 3, but shows the solar power generation unit from an opposite view.

Referring also to FIGS. 3 and 4, the solar power generation unit 300 includes a fixed lens unit 10, a movable barrel 120, a solar cell 30, and a drive unit 40.

The fixed lens unit 10 has a fixed focal length. The fixed lens unit 10 includes a fixed barrel 101, and a converging lens 102. The fixed barrel 101 has a first end 1011 and an opposite second end 1013. The fixed barrel 101 includes a rim 1012, which surrounds the fixed barrel 101 at the first end 1011 thereof. The fixed barrel 101 does not move relative to the movable barrel 120. The converging lens 102 is placed at the second end 1013 of the fixed barrel 101 to receive sunlight.

The converging lens 102 is a plano-convex lens or other kind of converging lens. In one embodiment, the converging lens 102 is coated with a layer of anti-reflective film (not shown). The fixed barrel 101 has threads 1010 in its inner wall. There may be a lens assembly located in the fixed barrel 101 according to need.

The movable barrel 120 has an inner bottom surface 1201 and an outer bottom surface 1202 at opposite sides of a bottom thereof. The solar cell 30 is placed at the inner bottom surface 1201. The movable barrel 120 has threads 1203 in its outer wall. The movable barrel 120 has a smaller diameter than the fixed barrel 101. The movable barrel 120 is located inside and threadedly engaged with the fixed barrel 101. The solar cell 30 receives sunlight passing through the converging lens 102 and generates electricity. The electricity is stored by a battery (not shown) and is received via a wire 503. There may be more solar cells or a solar panel located in the movable barrel 120 according to need.

The drive unit 40 is located outside the movable barrel 120 to move the movable barrel 120 forward or backward in reference to the converging lens 102 for adjusting a light intensity and a light receiving area of the solar cell 30. For example, the drive unit 40 includes a connecting rod 14 and a stepper motor 16. The connecting rod 14 connects the movable barrel 120 and the stepper motor 16. The stepper motor 16 is powered by a power source (not shown). The drive unit 40 may also drive the solar cell 30 directly in other embodiments.

The base 20 is substantially a cylinder and has an upper surface 201 and a lower surface 202 at opposite sides thereof. A central area of the per surface 201 sinks inwards to define a recess 200, and the rim 1012 of the fixed barrel 101 is in contact with the upper surface 201. The drive unit 40 is located at the bottom of the recess 200. The movable barrel 120 is capable of moving within the recess 200. That is, the recess 200 provides a moving space for the movable barrel 120, and receives the drive unit 40. One end of the supporting bar 80 is connected to the lower surface 202.

The cover 50 is made of glass. The cover 50 is located over the fixed lens unit 10 to protect the fixed lens unit 10 from rain when the optical axis of the converging lens 102 is perpendicular to the ground when it is rainy. In detail, the cover 50 is positioned on a light path of incident light of the fixed lens unit 10. The cover 50 includes a light receiving surface 500 and a back surface 502 at opposite sides thereof. The light receiving surface 500 may be coated with an anti-reflective layer 501 to increase the sunlight transmission intensity. Three connection posts 506 are interconnected between the upper surface 201 and the back surface 502, so that the cover 50 is connected to the base 20.

The solar power generation unit 300 is capable of adjusting the distance between the solar cell 30 and the converging lens 102. In this embodiment, the converging lens 102 or a similar converging lens assembly has a definite focal length. Assuming the incident light flux is definite, when the incident light is focused at a small area of the solar cell 30, the light intensity for the solar cell 30 will be high, then the drive unit 40 will drive the movable barrel 120 to move away from the focal plane, thus the converged incident light will fall on a bigger area than before, and therefore the light intensity will drop. In this way, the light intensity received by the solar cell 30 is adjusted to be stable, and the power output will be stable and the solar cell 30 will have a longer working life. In some embodiments, known methods may be employed to sense the light intensity received by the solar cell 30 to help the drive unit 40 decide if it is necessary to move the movable barrel 120.

Figure 5:
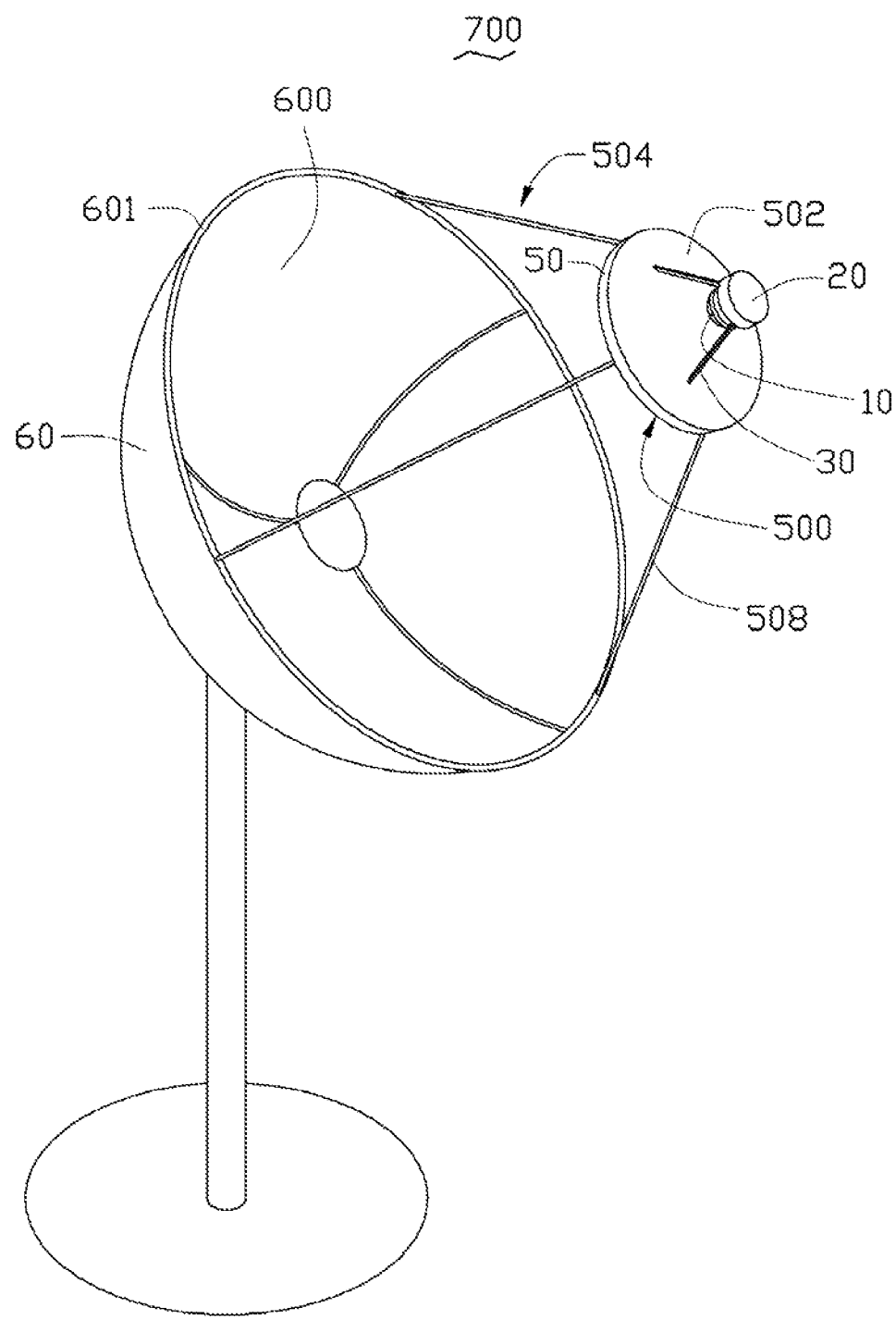
FIG. 5 is a schematic view of an adjustable solar power generation apparatus of a second exemplary embodiment.

Referring to FIG. 5, an adjustable solar power generation apparatus 700 of a second exemplary embodiment further includes a light-concentrating reflector 60 as well as the solar power generation unit 300, the cover 50, and the base 20. The light-concentrating reflector 60 is located opposite the solar power generation unit 300. The light-concentrating reflector 60 and the base 20 are positioned at opposite sides of the cover 50. The light-concentrating reflector 60 includes a reflective surface 600 for reflecting the sunlight to the solar power generation unit 300, and a rim 601 surrounding the reflective surface 600. The reflective surface 600 is of concave curvature. The solar power generation unit 300 is located at the focal point of the reflective surface 600 to receive the sunlight converged by the light-concentrating reflector 60.

The adjustable solar power generation apparatus 700 includes a connecting unit 504 connecting the rim 601 and the cover 50 (or alternatively connecting the rim 601 and the base 20 as a whole—not shown), and two connection poles 30 connecting the base 20 and the cover 50. The connecting unit 504 includes three straight bars 508 in this embodiment. In detail, one end of each of the straight bars 508 is connected to the rim 601, and the other end of each of the straight bars 508 is connected to the light receiving surface 500. One end of each of the connection poles 30 is connected to the back surface 502, and the other end of each of the connection poles 30 is connected to the base 20.

It is understood that the above-described embodiments are intended to illustrate rather than limit the disclosure. Variations may be made to the embodiments without departing from the spirit of the disclosure. Accordingly, it is appropriate that the appended claims be construed broadly and in a manner consistent with the scope of the disclosure.

What is claimed is:

1. An adjustable solar power generation apparatus, comprising:
    a solar power generation unit comprising:
        a fixed lens unit comprising a fixed barrel and a converging lens configured for converging sunlight, the fixed barrel having a first end and an opposite second end, the fixed barrel comprising a rim surrounding the first end thereof, the converging lens positioned at the second end of the fixed barrel;
        a movable barrel located inside and threadedly engaged with the fixed barrel, the movable barrel comprising an inner bottom surface facing the converging lens and an outer bottom surface, the inner bottom surface and the outer bottom surface located at opposite sides of a bottom of the movable barrel;
        a solar cell located on the inner bottom surface for receiving the converged sunlight; and
        a drive unit located outside the movable barrel and connected to the movable barrel;
    a base being substantially a cylinder and comprising an upper surface and a lower surface at opposite sides thereof, the upper surface defining a recess, the rim in contact with the upper surface, the drive unit located at the bottom of the recess and driving the movable barrel to move toward or away from the converging lens so as to move the solar cell toward or away from the converging lens to adjust a light intensity of the converged sunlight received by the solar cell, the recess thereby providing a moving space for the movable barrel to move toward or away from the converging lens; and
    a supporting bar connected to the lower surface of the base.

2. The adjustable solar power generation apparatus of claim 1, wherein the drive unit comprises a connecting rod and a stepper motor, and the connecting rod connects the stepper motor and the movable barrel.

3. The adjustable solar power generation apparatus of claim 2, further comprising a cover and three connection posts, wherein the cover comprises a light receiving surface and a back surface at opposite sides thereof, and the connection posts are each interconnected between the upper surface and the back surface.

4. The adjustable solar power generation apparatus of claim 3, wherein the cover is made of glass.

5. The adjustable solar power generation apparatus of claim 3, wherein the cover further comprises an anti-reflection layer formed on the light receiving surface.

6. An adjustable solar power generation apparatus, comprising:
    a solar power generation unit comprising:
        a fixed lens unit comprising a fixed barrel and a converging lens configured for converging sunlight, the fixed barrel having a first end and an opposite second end, the fixed barrel comprising a rim surrounding the first end thereof, the converging lens positioned at the second end of the fixed barrel;
        a movable barrel located inside and threadedly engaged with the fixed barrel, the movable barrel comprising an inner bottom surface facing the converging lens and an outer bottom surface, the inner bottom surface and the outer bottom surface located at opposite sides of a bottom of the movable barrel;
        a solar cell located on the inner bottom surface for receiving the converged sunlight; and
        a drive unit located outside the movable barrel and connected to the movable barrel;
    a base being substantially a cylinder and comprising an upper surface and a lower surface at opposite sides thereof, the upper surface defining a recess, the rim in contact with the upper surface, the drive unit located at the bottom of the recess and driving the movable barrel to move toward or away from the converging lens so as to move the solar cell toward or away from the converging lens to adjust a light intensity of the converged sunlight received by the solar cell, the recess thereby providing a moving space for the movable barrel to move toward or away from the converging lens;
    a cover comprising a light receiving surface and a back surface at opposite sides thereof, the base fixed to the back surface, the fixed lens unit facing the back surface;
    a light-concentrating reflector comprising an inwardly curved reflective surface for reflecting sunlight to the converging lens and a rim surrounding the reflective surface; and
    a connecting unit connecting the rim of the light-concentrating reflector and the light receiving surface.

7. The adjustable solar power generation apparatus of claim 6, wherein the converging lens is located at the focal point of the reflective surface.

8. The adjustable solar power generation apparatus of claim 7, wherein the connecting unit comprises three bars, one end of each of the bars is connected to the rim, and the other end of each of the bars is connected to the light receiving surface.

9. The adjustable solar power generation apparatus of claim 8, further comprising two connection poles, wherein one end of each of the connection poles is connected to the back surface, and the other end of each of the connection poles is connected to the base.

10. The adjustable solar power generation apparatus of claim 9, wherein the drive unit comprises a connecting rod and a stepper motor, and the connecting rod connects the stepper motor and the movable barrel.

* * * * *